US012796572B2

(12) United States Patent
Kang et al.

(10) Patent No.: US 12,796,572 B2

(45) Date of Patent: Nov. 10, 2026

(54) SEMICONDUCTOR PACKAGE

(71) Applicant: Samsung Electronics Co., Ltd., Suwon-si (KR)

(72) Inventors: Junghoon Kang, Suwon-si (KR); Daegon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 293 days.

(21) Appl. No.: 18/780,730

(22) Filed: Jul. 23, 2024

(65) Prior Publication Data

US 2025/0149516 A1 May 8, 2025

(30) Foreign Application Priority Data

Nov. 6, 2023 (KR) ........................ 10-2023-0151940

(51) Int. Cl.

*H10W 90/00* (2026.01)
*H10F 39/10* (2025.01)
*H10W 20/20* (2026.01)
*H10W 70/60* (2026.01)
*H10W 70/685* (2026.01)

(Continued)

(52) U.S. Cl.

CPC ............ *H10W 90/00* (2026.01); *H10F 39/10* (2025.01); *H10W 70/611* (2026.01); *H10W 70/685* (2026.01); *H10W 74/111* (2026.01); *H10B 80/00* (2023.02); *H10W 20/20* (2026.01); *H10W 70/60* (2026.01); *H10W 72/50* (2026.01); *H10W 90/701* (2026.01); *H10W 90/722* (2026.01); *H10W 90/731* (2026.01)

(58) Field of Classification Search

CPC . H10W 90/00; H10W 70/611; H10W 70/685; H10W 74/111; H10W 20/20; H10W 70/60; H10W 72/50; H10W 90/701; H10W 90/722; H10W 90/731; H10W 70/614; H10W 90/734; H10F 39/10; H10F 39/805; H10B 80/00; G02B 6/43; G02B 6/4201; G02B 6/4274

See application file for complete search history.

(56) References Cited

U.S. PATENT DOCUMENTS 9,671,572 B2 6/2017 Decker et al.
10,290,619 B2 5/2019 Evans et al.

(Continued)

OTHER PUBLICATIONS

Y. Zhang, et.al., "High-Density Wafer-Scale 3-D Silicon-Photonic Integrated Circuits," IEEE Journal of Selected Topics in Quantum Electronics, Nov.-Dec. 2018, pp. 1-10 vol. 24, No. 6.

*Primary Examiner* — David Vu

(74) *Attorney, Agent, or Firm* — Muir Patent Law, PLLC

(57) ABSTRACT

A semiconductor package including a package substrate, a plurality of photonics bridge chips located on the package substrate, a molding layer located on the package substrate, surrounding the plurality of photonics bridge chips, and including a plurality of via electrodes, and a plurality of chiplets located on the molding layer and the plurality of photonics bridge chips, the chiplets each including a photonics chip and a semiconductor chip located on the photonics chip, wherein the plurality of chiplets are spaced apart from each other in a horizontal direction, and at least two chiplets adjacent to each other from among the plurality of chiplets overlap one photonics bridge chip from among the plurality of photonics bridge chips in a vertical direction.

20 Claims, 7 Drawing Sheets

(51) Int. Cl.

| | |
|---|---|
| ***H10W 74/10*** | (2026.01) |
| *H10B 80/00* | (2023.01) |
| *H10W 72/50* | (2026.01) |

(56) References Cited

U.S. PATENT DOCUMENTS

| | | | |
|---|---|---|---|
| 10,608,663 | B2 | 3/2020 | Gould et al. |
| 10,712,499 | B2 | 7/2020 | Bulumulla et al. |
| 10,740,693 | B2 | 8/2020 | Lazovich et al. |
| 10,763,974 | B2 | 9/2020 | Bunandar et al. |
| 10,803,258 | B2 | 10/2020 | Kenney et al. |
| 10,803,259 | B2 | 10/2020 | Kenney et al. |
| 10,877,217 | B2 | 12/2020 | Byrd et al. |
| 10,884,313 | B2 | 1/2021 | Gould |
| 11,023,691 | B2 | 6/2021 | Kenney et al. |
| 11,036,002 | B2 | 6/2021 | Harris et al. |
| 11,043,478 | B2 | 6/2021 | Traverso et al. |
| 11,093,215 | B2 | 8/2021 | Harris et al. |
| 11,169,780 | B2 | 11/2021 | Harris et al. |
| 11,196,395 | B2 | 12/2021 | Harris et al. |
| 11,209,856 | B2 | 12/2021 | Bunandar et al. |
| 11,215,753 | B2 * | 1/2022 | Islam ................. G02B 6/12004 |
| 11,218,227 | B2 | 1/2022 | Bunandar et al. |
| 11,256,029 | B2 | 2/2022 | Kannan et al. |
| 11,281,068 | B2 | 3/2022 | Gould |
| 11,367,711 | B2 | 6/2022 | Harris et al. |
| 11,398,871 | B2 | 7/2022 | Bunandar et al. |
| 11,409,045 | B2 | 8/2022 | Dorta-Quinones et al. |
| 11,475,367 | B2 | 10/2022 | Lazovich et al. |
| 11,494,541 | B2 | 11/2022 | Ramey et al. |
| 11,609,742 | B2 | 3/2023 | Harris et al. |
| 11,626,931 | B2 | 4/2023 | Bunandar et al. |
| 11,671,182 | B2 | 6/2023 | Bunandar et al. |
| 11,686,902 | B2 | 6/2023 | Dorta-Quinones et al. |
| 11,695,378 | B2 | 7/2023 | Harris et al. |
| 2020/0128669 | A1 | 4/2020 | Schober et al. |
| 2022/0399278 | A1 | 12/2022 | Marin |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2023-0151940, filed on Nov. 6, 2023, in the Korean Intellectual Property Office, the disclosure of which is incorporated by reference herein in its entirety.

BACKGROUND

Aspects of the inventive concept relate to a semiconductor package and a method of manufacturing the same, and more particularly, to a semiconductor package including a photonics chip.

The advantages of semiconductor packages are increasingly being utilized to improve the functionality of electronic devices and integrate components. A semiconductor package allows various integrated circuits, such as memory chips or logic chips, to be mounted on a package substrate. Recently, in an environment where data traffic is increasing in data centers and communication infrastructure, researches on semiconductor packages including optical integrated circuits are being continuously conducted.

SUMMARY

Aspects of the inventive concept provide a semiconductor package including a miniaturized photonics chip.

One aspect of the inventive concept provides a semiconductor package including a photonics chip with fewer errors and failures.

In addition, the technical goals to be achieved according to aspects of the inventive concept are not limited to the technical goals mentioned above, and other technical goals may be clearly understood by one of ordinary skill in the art from the following descriptions.

According to an aspect of the inventive concept, there is provided a semiconductor package including a package substrate, a plurality of photonics bridge chips located on the package substrate, a molding layer located on the package substrate, surrounding the plurality of photonics bridge chips, and including a plurality of via electrodes, and a plurality of chiplets located on the molding layer and the plurality of photonics bridge chips, each of the plurality of chiplets including a photonics chip and a semiconductor chip located on the photonics chip, wherein the plurality of chiplets are spaced apart from each other in a horizontal direction, and at least two chiplets adjacent to each other from among the plurality of chiplets overlap one photonics bridge chip from among the plurality of photonics bridge chips in a vertical direction.

According to another aspect of the inventive concept, there is provided a semiconductor package including a package substrate including a plurality of cavities extending inward from a top surface of the package substrate, a plurality of photonics bridge chips located within the plurality of cavities of the package substrate, respectively, and a plurality of chiplets located on the package substrate and the plurality of photonics bridge chips, each of the plurality of chiplets including a photonics chip and a semiconductor chip located on the photonics chip, wherein the plurality of chiplets are spaced apart from each other in a horizontal direction, and at least two chiplets adjacent to each other from among the plurality of chiplets overlap one photonics bridge chip from among the plurality of photonics bridge chips in a vertical direction.

According to another aspect of the inventive concept, there is provided a semiconductor package including a package substrate, a redistribution layer located on the package substrate, a plurality of photonics bridge chips located on the redistribution layer, a molding layer located on the redistribution layer, surrounding the plurality of photonics bridge chips, and including a plurality of via electrodes, and a plurality of chiplets located on the molding layer and the plurality of photonics bridge chips, each of the plurality of chiplets including a photonics chip and a semiconductor chip located on the photonics chip, wherein the plurality of chiplets are spaced apart from each other in a horizontal direction, at least two chiplets adjacent to each other from among the plurality of chiplets overlap one of the plurality of photonics bridge chips in a vertical direction, and the photonics chip includes an active surface, an inactive surface facing the active surface, and a waveguide located on the inactive surface.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
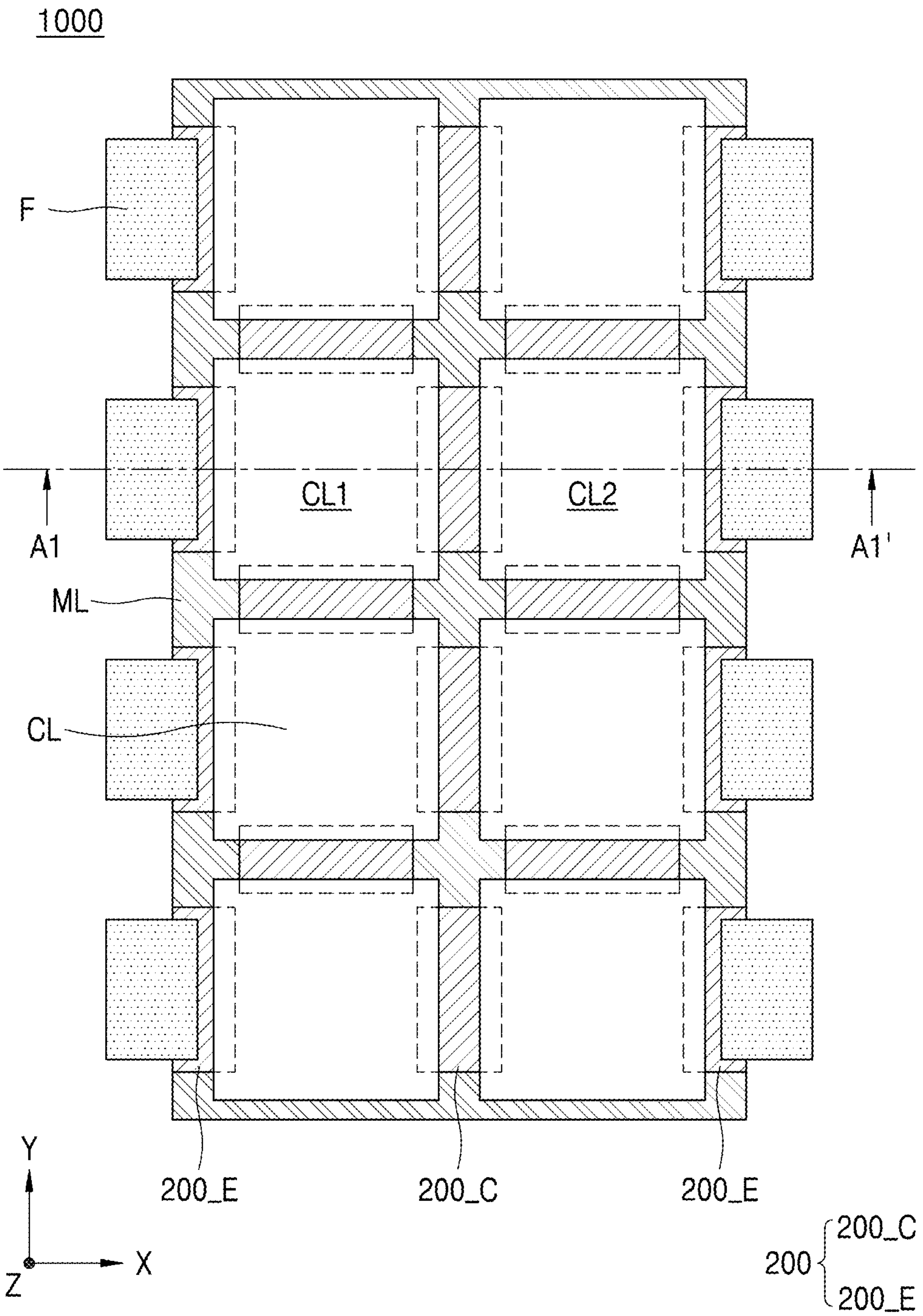
FIG. 1 is a schematic plan view of a semiconductor package according to an embodiment.
Figure 2:
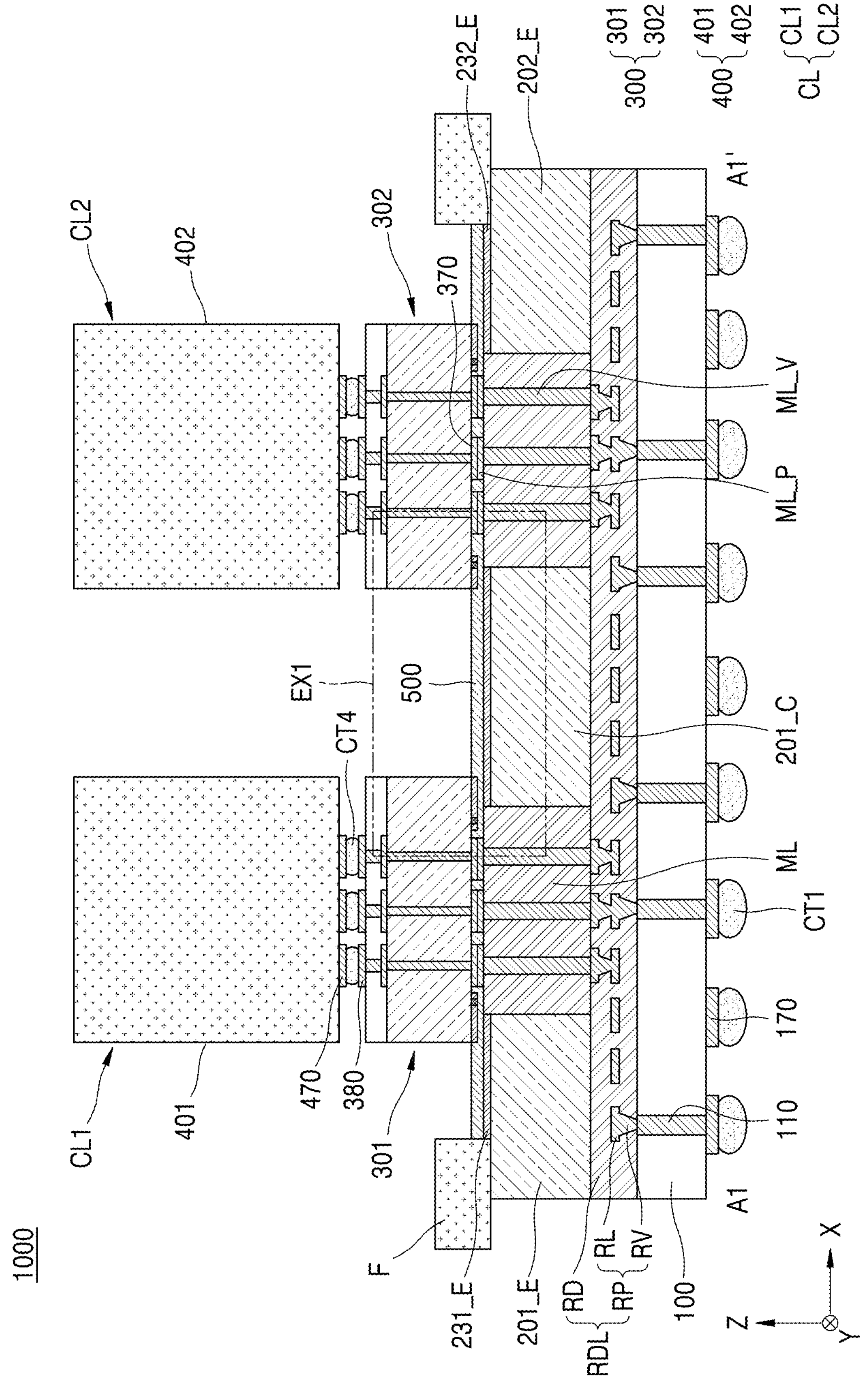
FIG. 2 is a schematic cross-sectional view of the semiconductor package of FIG. 1, taken along a line A1-A1' of FIG. 1.
Figure 3:
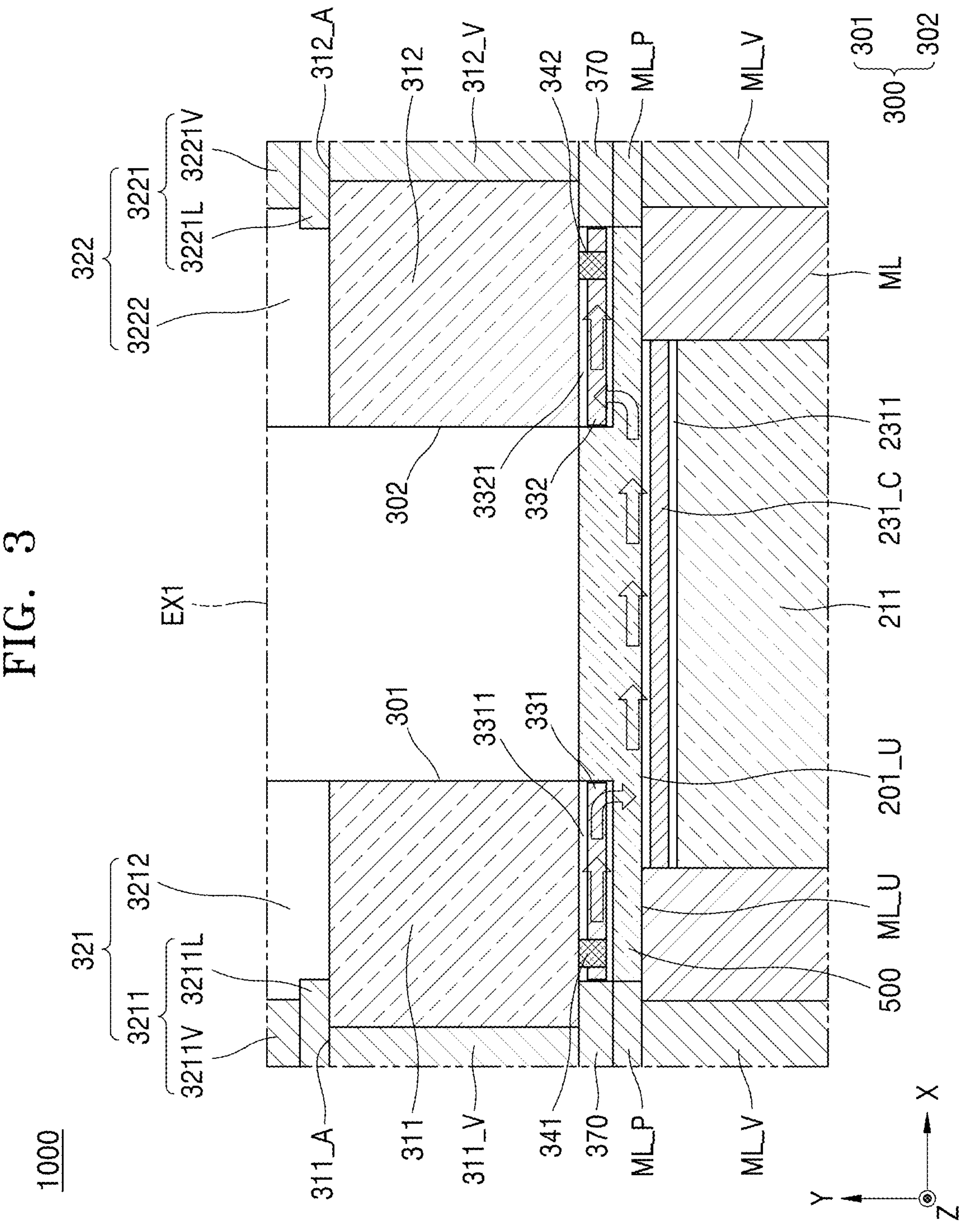
FIG. 3 is an enlarged view of a portion "EX1" of the semiconductor package of FIG. 2.

FIG. 1 is a schematic plan view of a semiconductor package 1000 according to an embodiment. FIG. 2 is a schematic cross-sectional view of the semiconductor package 1000 of FIG. 1, taken along a line A1-A1' of FIG. 1. FIG. 3 is an enlarged view of a portion "EX1" of the semiconductor package 1000 of FIG. 2.

Referring to FIGS. 1 to 3, the semiconductor package 1000 may include a package substrate 100, a plurality of photonics bridge chips 200, and a plurality of chiplets CL.

Hereinafter, unless specifically defined, the direction parallel to the top surface of the package substrate 100 is defined as a first horizontal direction (X direction), the direction perpendicular to the top surface of the package substrate 100 is defined as a vertical direction (Z direction), and the direction perpendicular to the first horizontal direction (X direction) and the vertical direction (Z direction) is defined as a second horizontal direction (Y direction). The first horizontal direction (X direction) and the second horizontal direction (Y direction) are collectively defined as a horizontal direction or horizontal directions.

The package substrate 100 of the semiconductor package 1000 may include a substrate and a through via 110 penetrating through the substrate. According to some embodiments, the substrate of the package substrate 100 may be a glass substrate, and the through via 110 may be a glass through via.

The package substrate 100 may include a lower pad 170 located on the bottom surface thereof. The lower pad 170 may be electrically connected to the through via 110 of the package substrate 100. According to some embodiments, lower pads 170 may each include copper, nickel, stainless steel, or beryllium copper.

External connection terminals CT1 may be attached to the lower pads 170. The external connection terminals CT1 may be configured to electrically and physically interconnect the package substrate 100 to an external device, on which the package substrate 100 is mounted. The external connection terminals CT1 may include, for example, solder balls or solder bumps.

However, aspects of the inventive concept are not limited thereto, and the package substrate 100 may be mounted into a socket formed on an external device. For example, the package substrate 100 may be electrically and physically connected to an external device without the external connection terminals CT1.

The package substrate 100 may further include a redistribution layer RDL. The redistribution layer RDL may be located on the top surface of the package substrate 100. According to some embodiments, the horizontal area of the redistribution layer RDL may be substantially equal to the horizontal area of the package substrate 100.

The redistribution layer RDL may include a redistribution pattern RP and a redistribution insulation layer RD surrounding the redistribution pattern RP. The redistribution pattern RP of the redistribution layer RDL may be electrically connected to the through via 110 of the package substrate 100.

The redistribution insulation layer RD may include an insulation material, for example, photo imageable dielectric (PID) resin. According to some embodiments, the redistribution insulation layer RD may further include an inorganic filler. According to some embodiments, the redistribution insulation layer RD may have a multi-layered structure in which the redistribution pattern RP is disposed on each layer.

The redistribution pattern RP may include a redistribution line pattern RL extending in the horizontal direction and a redistribution via pattern RV extending in the vertical direction (Z direction) from the redistribution line pattern RL. The redistribution line pattern RL may be disposed on at least one of the top surface and the bottom surface of the redistribution insulation layer RD or inside the redistribution insulation layer RD. The redistribution via pattern RV may penetrate the redistribution insulation layer RD and be connected to a portion of the redistribution line pattern RL.

The redistribution pattern RP may include a conductive material, e.g., Cu, aluminum (Al), silver (Ag), tin (Sn), gold (Au), nickel (Ni), lead (Pb), titanium (Ti), or alloys thereof.

According to some embodiments, although not illustrated, the package substrate 100 may further include the redistribution layer RDL located on the bottom surface of the package substrate 100. For example, the redistribution layer RDL located on the top surface of the package substrate 100 may be referred to as an upper redistribution layer, and the redistribution layer RDL located on the bottom surface of the package substrate 100 may be referred to as a lower redistribution layer. Components and materials constituting the lower redistribution layer and the upper redistribution layer may be substantially the same.

The plurality of photonics bridge chips 200 of the semiconductor package 1000 may be located on the package substrate 100. The plurality of photonics bridge chips 200 may be located on the redistribution layer RDL of the package substrate 100. The plurality of photonics bridge chips 200 may be electrically insulated from (e.g., not electrically connected to) the package substrate 100 and the lower pad 170.

The plurality of photonics bridge chips 200 may include edge photonics bridge chips 200_E and center photonics bridge chips 200_C. According to some embodiments, the edge photonics bridge chips 200_E may be located at an edge region of the package substrate 100, and the center photonics bridge chips 200_C may be located at the center region of the package substrate 100. For example, the edge photonics bridge chips 200_E may be arranged to surround the center photonics bridge chips 200_C.

According to some embodiments, an edge photonics bridge chip 200_E may overlap one chiplet in the vertical direction (Z direction), and a center photonics bridge chip 200_C may overlap at least two chiplets in the vertical direction (Z direction). For example, the center photonics bridge chip 200_C may transmit an optical signal from one of overlapped chiplets to the other one of overlapped chiplets.

The semiconductor package 1000 may further include optical fibers F connected to the edge photonics bridge chips 200_E. For example, an optical fiber F may be located on a region of the edge photonics bridge chip 200_E that does not overlap a chiplet. An optical signal input from the optical fiber F to the edge photonics bridge chip 200_E may be transmitted to a photonics chip 300 of a chiplet that overlaps the edge photonics bridge chip 200_E through a bridge waveguide.

The semiconductor package 1000 may further include a molding layer ML and a via electrode ML_V that penetrates the molding layer ML. The molding layer ML is located above the package substrate 100 and may surround the plurality of photonics bridge chips 200. For example, the molding layer ML and the via electrode ML_V may be located on the redistribution layer RDL of the package substrate 100. The molding layer ML may contact side surfaces of the plurality of photonics bridge chips 200. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting," "in contact with," or "contact" another element, there are no intervening elements present at the point of contact.

According to some embodiments, a top surface ML_U of the molding layer ML may be coplanar with top surfaces 201_U of the plurality of photonics bridge chips 200. For example, in the process of forming the molding layer ML, after the molding layer ML is formed to cover the plurality of photonics bridge chips 200, a portion of the molding layer ML may be removed through a grinding process. At this time, the top surface of the molding layer ML and the top surfaces of the plurality of photonics bridge chips 200 may become coplanar with each other.

The via electrode ML_V may include a conductive material, e.g., Cu, aluminum (Al), silver (Ag), tin (Sn), gold (Au), nickel (Ni), lead (Pb), titanium (Ti), or alloys thereof. The molding layer ML may include epoxy resin or polyimide resin. The molding layer ML may include, for example, epoxy molding compound (EMC).

The via electrode ML_V may be electrically connected to the redistribution pattern RP of the redistribution layer RDL. According to some embodiments, the via electrode ML_V may include an electrically conductive material, and an upper pad ML_P may be located above the via electrode ML_V.

The plurality of chiplets CL of the semiconductor package 1000 may be located on the molding layer ML and the plurality of photonics bridge chips 200. The plurality of chiplets CL may be spaced apart from each other in the horizontal direction.

Although FIG. 1 shows that the plurality of chiplets CL are arranged in a 4×2 matrix, the arrangement and the number of the plurality of chiplets CL are not limited thereto.

The plurality of chiplets CL may each include the photonics chip 300 and a semiconductor chip 400. The photonics chip 300 may be located on the plurality of photonics bridge chips 200, and the semiconductor chip 400 may be located on the photonics chip 300. The photonics chip 300 and the semiconductor chip 400 of each of the plurality of chiplets CL may have a one-to-one correspondence.

The photonics chip 300 of each of the plurality of chiplets CL may convert optical signals into electrical signals. For example, the photonics chip 300 may include a photonic integrated circuit (PIC) and an electronic integrated circuit (EIC). The PIC may convert optical signals into electrical signals, and the EIC may control high frequency signals input/output to/from the PIC. The semiconductor chip 400 of each of the plurality of chiplets CL may be located on the photonics chip 300. An electrical signal converted from the photonics chip 300 may be input to the semiconductor chip 400, and the semiconductor chip 400 may output an electrical signal to the photonics chip 300.

According to some embodiments, the semiconductor chip 400 may include a memory chip, a system-on-chip (SoC), a logic chip, a power management integrated circuit (PMIC) chip, etc. The memory chip may include a DRAM chip, an SRAM chip, an MRAM chip, and/or a NAND flash memory chip. The logic chip may include an application processor (AP), a microprocessor, a central processing unit (CPU), a controller, or an application specific integrated circuit (ASIC).

According to some embodiments, the photonics chip 300 may further include an upper pad 380 located on the top surface of the photonics chip 300, and the semiconductor chip 400 may further include a lower pad 470 located on the bottom surface of the semiconductor chip 400. The upper pad 380 and the lower pad 470 may be electrically connected to each other through a connection terminal CT4. However, aspects of the inventive concept are not limited thereto, and the upper pad 380 of the photonics chip 300 and the lower pad 470 of the semiconductor chip 400 may be electrically connected to each other through an anisotropic film (ACF), a non-conductive film (NCF), direct bonding, or hybrid bonding.

According to some embodiments, at least two chiplets adjacent to each other from among the plurality of chiplets CL may be located on one photonics bridge chip. For example, at least two chiplets adjacent to each other from among the plurality of chiplets CL may overlap one photonics bridge chip in the vertical direction (Z direction). For example, at least two chiplets adjacent to each other from among the plurality of chiplets CL may overlap one center photonics bridge chip 200_C in the vertical direction (Z direction).

According to some embodiments, the horizontal area of the center photonics bridge chip 200_C may be less than the horizontal area of each of the plurality of chiplets CL. For example, the horizontal area of the center photonics bridge chip 200_C may be less than the horizontal area of the photonics chip 300 of each of the plurality of chiplets CL.

The upper pad ML_P of the molding layer ML may be electrically connected to a lower pad 370 of the photonics chip 300 of each of the plurality of chiplets CL. According to some embodiments, the upper pad ML_P of the molding layer ML and the lower pad 370 of the photonics chip 300 may be electrically connected to each other by an adhesive film 500. For example, the adhesive film 500 may include an ACF or an NCF.

However, aspects of the inventive concept are not limited thereto, and the upper pad ML_P of the molding layer ML and the lower pad 370 of the photonics chip 300 may be electrically connected to each other through solder ball attaching, direct bonding, or hybrid bonding.

Referring to FIGS. 2 and 3, the plurality of photonics bridge chips 200 and the plurality of chiplets CL will be described in detail.

The plurality of photonics bridge chips 200 may include a first edge photonics bridge chip 201_E, a second edge photonics bridge chip 202_E, and a first center photonics bridge chip 201_C.

The plurality of chiplets CL may include a first chiplet CL1 and a second chiplet CL2. The first chiplet CL1 may include a first photonics chip 301 and a first semiconductor chip 401. The second chiplet CL2 may include a second photonics chip 302 and a second semiconductor chip 402.

The first chiplet CL1 and the second chiplet CL2 may be spaced apart from each other in the first horizontal direction (X direction). The first center photonics bridge chip 201_C may be located between the first edge photonics bridge chip 201_E and the second edge photonics bridge chip 202_E.

The first chiplet CL1 may overlap the first edge photonics bridge chip 201_E and the first center photonics bridge chip 201_C in the vertical direction (Z direction). The second chiplet CL2 may overlap the second edge photonics bridge chip 202_E and the first center photonics bridge chip 201_C in the vertical direction (Z direction). For example, the first chiplet CL1 and the second chiplet CL2 arranged adjacent to each other, may each overlap one first center photonics bridge chip 201_C in the vertical direction (Z direction). Specifically, the first chiplet CL1 and the second chiplet CL2 arranged adjacent to each other, may each overlap the same first center photonics bridge chip 201_C in the vertical direction (Z direction).

Hereinafter, the edge photonics bridge chips 200_E and the center photonics bridge chips 200_C of the plurality of photonics bridge chips 200 will be described in detail by using the first edge photonics bridge chip 201_E, the second edge photonics bridge chip 202_E, and the first center photonics bridge chip 201_C as examples. Also, the plurality of chiplets CL will be described in detail by using the first chiplet CL1 and the second chiplet CL2 as examples.

The first center photonics bridge chip 201_C may include a bridge substrate 211, a bridge insulation layer 2311, and a center bridge waveguide 231_C.

The first photonics chip 301 may be located above one end of the first center photonics bridge chip 201_C, and the second photonics chip 302 may be located above the other end of the first center photonics bridge chip 201_C. According to some embodiments, the first center photonics bridge chip 201_C may overlap the first chiplet CL1 and the second chiplet CL2 in the vertical direction (Z direction).

For example, the first center photonics bridge chip 201_C may be located below the space between the first photonics chip 301 and the second photonics chip 302. The first photonics chip 301 and the second photonics chip 302 may be offset-stacked on the first center photonics bridge chip 201_C.

The bridge substrate 211 may include a semiconductor material such as silicon (Si). Alternatively, the bridge substrate 211 may include a semiconductor material such as germanium (Ge). According to some embodiments, the bottom surface of the bridge substrate 211 may be in contact with the redistribution layer RDL.

The bridge insulation layer 2311 may be located on the top surface of the bridge substrate 211. For example, the bridge insulation layer 2311 may completely cover the top surface of the bridge substrate 211. For example, the bridge insulation layer 2311 may include silicon oxide.

The center bridge waveguide 231_C may be located inside the bridge insulation layer 2311. For example, the center bridge waveguide 231_C may be buried in the bridge insulation layer 2311. The center bridge waveguide 231_C may be located on the top surface of the bridge substrate 211. For example, the center bridge waveguide 231_C may be a silicon waveguide.

The center bridge waveguide 231_C may extend in the horizontal direction and serve as a path through which optical signals travel. According to some embodiments, one end of the center bridge waveguide 231_C may overlap the first photonics chip 301 in the vertical direction (Z direction), and the other end of the center bridge waveguide 231_C may overlap the second photonics chip 302 in the vertical direction (Z direction). The center bridge waveguide 231_C may transmit an optical signal from the first photonics chip 301 to the second photonics chip 302 and may transmit an optical signal from the second photonics chip 302 to the first photonics chip 301.

The first edge photonics bridge chip 201_E and the second edge photonics bridge chip 202_E may include components substantially identical to those of the first center photonics bridge chip 201_C. Descriptions of the first edge photonics bridge chip 201_E, the second edge photonics bridge chip 202_E, and the first center photonics bridge chip 201_C already given above will be omitted, and the differences therebetween will be described below.

The first edge photonics bridge chip 201_E overlaps the first photonics chip 301 in the vertical direction (Z direction), and the optical fiber F may be attached to the top surface of the first edge photonics bridge chip 201_E. The second edge photonics bridge chip 202_E overlaps the second photonics chip 302 in the vertical direction (Z direction), and the optical fiber F may be attached to the top surface of the second edge photonics bridge chip 202_E.

For example, a first edge bridge waveguide 231_E of the first edge photonics bridge chip 201_E may become a path through which an optical signal travels between the optical fiber F and the first photonics chip 301, and a second edge bridge waveguide 232_E may become a path through which an optical signal travels between the optical fiber F and the second photonics chip 302.

The first photonics chip 301 of the first chiplet CL1 may include a first substrate 311, a first wiring structure 321, and a first waveguide 331. The first substrate 311 of the first photonics chip 301 may include an active surface 311_A and an inactive surface facing the active surface 311_A. The first wiring structure 321 may be formed on the active surface 311_A of the first substrate 311. The first photonics chip 301 may include a first through via 311_V extending from the inactive surface of the first substrate 311 to the active surface 311_A of the first substrate 311.

The first substrate 311 may include a semiconductor material such as silicon (Si). Alternatively, the first substrate 311 may include a semiconductor material such as germanium (Ge).

According to some embodiments, a plurality of individual devices used by a first optical component 341 of the first waveguide 331 to interface with other individual devices may be located on the active surface 311_A of the first substrate 311. For example, the plurality of individual devices may include CMOS drivers, transimpedance amplifiers, etc. to perform functions such as controlling high-frequency signaling of the first optical component 341.

The first wiring structure 321 may be located on the active surface 311_A of the first substrate 311. The first wiring structure 321 may include a first wiring pattern 3211 and a first wiring insulation layer 3212 surrounding the first wiring pattern 3211. The first wiring pattern 3211 may include a first wiring line 3211L extending in the horizontal direction and a first wiring via 3211V extending in the vertical direction from the first wiring line 3211L. The first wiring pattern 3211 may be electrically connected to the plurality of individual devices and the first through via 311_V.

The first waveguide 331 may be located on the inactive surface of the first substrate 311. The first waveguide 331 and the plurality of individual devices may be spaced apart from each other in the vertical direction (Z direction). For example, the first waveguide 331 and the plurality of individual devices of the first photonics chip 301 may be spaced apart from each other with the first substrate 311 therebetween.

According to some embodiments, a first insulation layer 3311 may surround the first waveguide 331 and may be located on the inactive surface of the first substrate 311. For example, the first waveguide 331 may be buried by the first insulation layer 3311. For example, the first insulation layer 3311 may include silicon oxide, and the first waveguide 331 may be a silicon waveguide.

The first waveguide 331 may be connected to the first optical component 341. The first optical component 341 may convert optical signals into electrical signals and convert electrical signals into optical signals. According to some embodiments, first optical component 341 may include a photo detector, a laser diode, and a modulator.

In the process that an optical signal is input to the first chiplet CL1, the photo detector may detect the optical signal input to the first photonics chip 301. For example, the first photonics chip 301 may detect an optical signal input through the photo detector and convert the optical signal into an electrical signal. An electrical signal generated by the photo detector may be transmitted to the plurality of individual devices on the active surface 311_A of the first substrate 311 through the first through via 311_V of the first photonics chip 301.

In the process that the first chiplet CL1 outputs an optical signal, the plurality of individual devices on the active surface 311_A of the first substrate 311 of the first photonics chip 301 may transmit an electric signal to the modulator. In response to a received electrical signal, the modulator may convert the received electrical signal into an optical signal by modulating the light emitted by the laser diode according to electrical signal.

For example, an optical signal transmitted from the first edge bridge waveguide 231_E of the first edge photonics bridge chip 201_E to the first waveguide 331 of the first photonics chip 301 may be converted into an electrical signal through a photo detector of the first waveguide 331. Furthermore, an electronic signal emitted from the first semiconductor chip 401 may be converted into an optical signal through the laser diode and the modulator of the first waveguide 331.

According to some embodiments, the first photonics chip 301 may be disposed on the first center photonics bridge chip 201_C such that the active surface 311_A of the first substrate 311 faces the first semiconductor chip 401. For example, the plurality of individual devices and the first wiring structure 321 may be located on the top surface (i.e., the active surface 311_A) of the first photonics chip 301, and the first waveguide 331 may be located on the bottom surface of the first photonics chip 301.

According to some embodiments, the first waveguide 331 of the first photonics chip 301 may face the center bridge waveguide 231_C of the first center photonics bridge chip 201_C and the first edge bridge waveguide 231_E of the first edge photonics bridge chip 201_E.

For example, an optical signal emitted from the optical fiber F may be input to the first photonics chip 301 through the first edge photonics bridge chip 201_E, and an optical signal output from the first photonics chip 301 may be input to the second photonics chip 302 through the first center photonics bridge chip 201_C.

The second photonics chip 302 of the second chiplet CL2 may include a second substrate 312, a second wiring structure 322, and a second waveguide 332. The second substrate 312 of the second photonics chip 302 may include an active surface 312_A and an inactive surface facing the active surface 312_A. The second wiring structure 322 may be formed on the active surface 312_A of the second substrate 312. The second photonics chip 302 may include a second through via 312_V extending from the inactive surface of the second substrate 312 to the active surface 312_A of the second substrate 312.

Components and a material constituting the second photonics chip 302 may be substantially identical to those of the first photonics chip 301. Hereinafter, descriptions of the first photonics chip 301 and the second photonics chip 302 already given above will be omitted and the differences therebetween will be described below.

According to some embodiments, when a surface of the second substrate 312 on which the plurality of individual devices of the second photonics chip 302 are located is referred to as an active surface, the second waveguide 332 may be located on an inactive surface.

According to some embodiments, the second waveguide 332 may be spaced apart from a plurality of individual devices of the second photonics chip 302 with the second substrate 312 therebetween. A second optical component 342 of the second waveguide 332 and the plurality of individual devices of the second photonics chip 302 may be electrically connected to each other through the second through via 312_V.

According to some embodiments, the second waveguide 332 may include the second optical component 342. The second optical component 342 may convert optical signals into electrical signals and convert electrical signals into optical signals.

According to some embodiments, a second insulation layer 3321 surrounds the second waveguide 332 and may be located on the inactive surface of the second substrate 312. For example, the second waveguide 332 may be buried by the second insulation layer 3321. For example, the second insulation layer 3321 may include silicon oxide, and the second waveguide 332 may be a silicon waveguide.

According to some embodiments, the second photonics chip 302 may be disposed on the first center photonics bridge chip 201_C such that the active surface 312_A of the second substrate 312 faces the second semiconductor chip 402. For example, the plurality of individual devices and the second wiring structure 322 may be located on the top surface (i.e., the active surface 312_A) of the second photonics chip 302, and the second waveguide 332 may be located on the bottom surface of the second photonics chip 302.

According to some embodiments, the second waveguide 332 of the second photonics chip 302 may face the center bridge waveguide 231_C of the first center photonics bridge chip 201_C and the second edge bridge waveguide 232_E of the second edge photonics bridge chip 202_E.

An optical signal emitted from the first photonics chip 301 may be input to the second photonics chip 302 through the first center photonics bridge chip 201_C, and an optical signal output from the second photonics chip 302 may be emitted to the optical fiber F through the second edge photonics bridge chip 202_E.

According to some embodiments, one end of the center bridge waveguide 231_C of the first center photonics bridge chip 201_C may overlap the first waveguide 331 in the vertical direction (Z direction), and the other end of the center bridge waveguide 231_C may overlap the second waveguide 332 in the vertical direction (Z direction). For example, an optical signal emitted from the first waveguide 331 may travel to the second waveguide 332 through the center bridge waveguide 231_C.

According to some embodiments, the first edge bridge waveguide 231_E may overlap the first waveguide 331 and the optical fiber F in the vertical direction (Z direction). The center bridge waveguide 231_C may overlap the first waveguide 331 and the second waveguide 332 in the vertical direction (Z direction). The second edge bridge waveguide 232_E may overlap the second waveguide 332 and the optical fiber F in the vertical direction (Z direction).

For example, the first waveguide 331 and the center bridge waveguide 231_C may be optically connected to each other, and the center bridge waveguide 231_C and the second waveguide 332 may be optically connected to each other. For example, the first waveguide 331 and the center bridge waveguide 231_C may be optically connected to each other through an evanescent coupler, and the center bridge waveguide 231_C and the second waveguide 332 may be optically connected to each other through an evanescent coupler.

According to some embodiments, the first photonics chip 301 and the second photonics chip 302 may overlap the first center photonics bridge chip 201_C in the vertical direction (Z direction). For example, the first waveguide 331 and the second waveguide 332 may be optically connected to each other through one photonics bridge chip.

The first semiconductor chip 401 of the first chiplet CL1 may be located on the first photonics chip 301. The second semiconductor chip 402 of the second chiplet CL2 may be located on the second photonics chip 302. The first semiconductor chip 401 and the second semiconductor chip 402 may each include an active surface and an inactive surface facing the active surface.

According to some embodiments, the first semiconductor chip 401 may be located on the first photonics chip 301 such that the active surface of the first semiconductor chip 401 faces downward. For example, the first semiconductor chip 401 may be located on the first photonics chip 301 in a face-down manner. The second semiconductor chip 402 may be located on the second photonics chip 302 such that the active surface of the second semiconductor chip 402 faces downward. For example, the second semiconductor chip 402 may be located on the second photonics chip 302 in a face-down manner.

According to some embodiments, a plurality of individual devices of various types may be located on active surfaces of the first semiconductor chip 401 and the second semiconductor chip 402. For example, the plurality of individual devices may include various microelectronic devices, e.g., a complementary metal-oxide semiconductor (CMOS) transistor, a metal-oxide-semiconductor field effect transistor (MOSFET), a system large scale integration (LSI), an image sensor such as a CMOS imaging sensor (CIS), a micro-electro-mechanical system (MEMS), an active device, a passive device, etc.

According to some embodiments, the first semiconductor chip 401 and the second semiconductor chip 402 may be semiconductor chips of the same type. However, aspects of the inventive concept are not limited thereto, and the first semiconductor chip 401 and the second semiconductor chip 402 may be semiconductor chips of different types.

According to some embodiments, in each of the plurality of chiplets CL, one semiconductor chip may be mounted on one photonics chip. Photonics chips 300 of the plurality of chiplets CL may transmit and receive optical signals to and from each other through the plurality of photonics bridge chips 200. Therefore, the photonics chip 300 may be miniaturized, and thus the yield of the photonics chip 300 may be improved.

Figure 4:
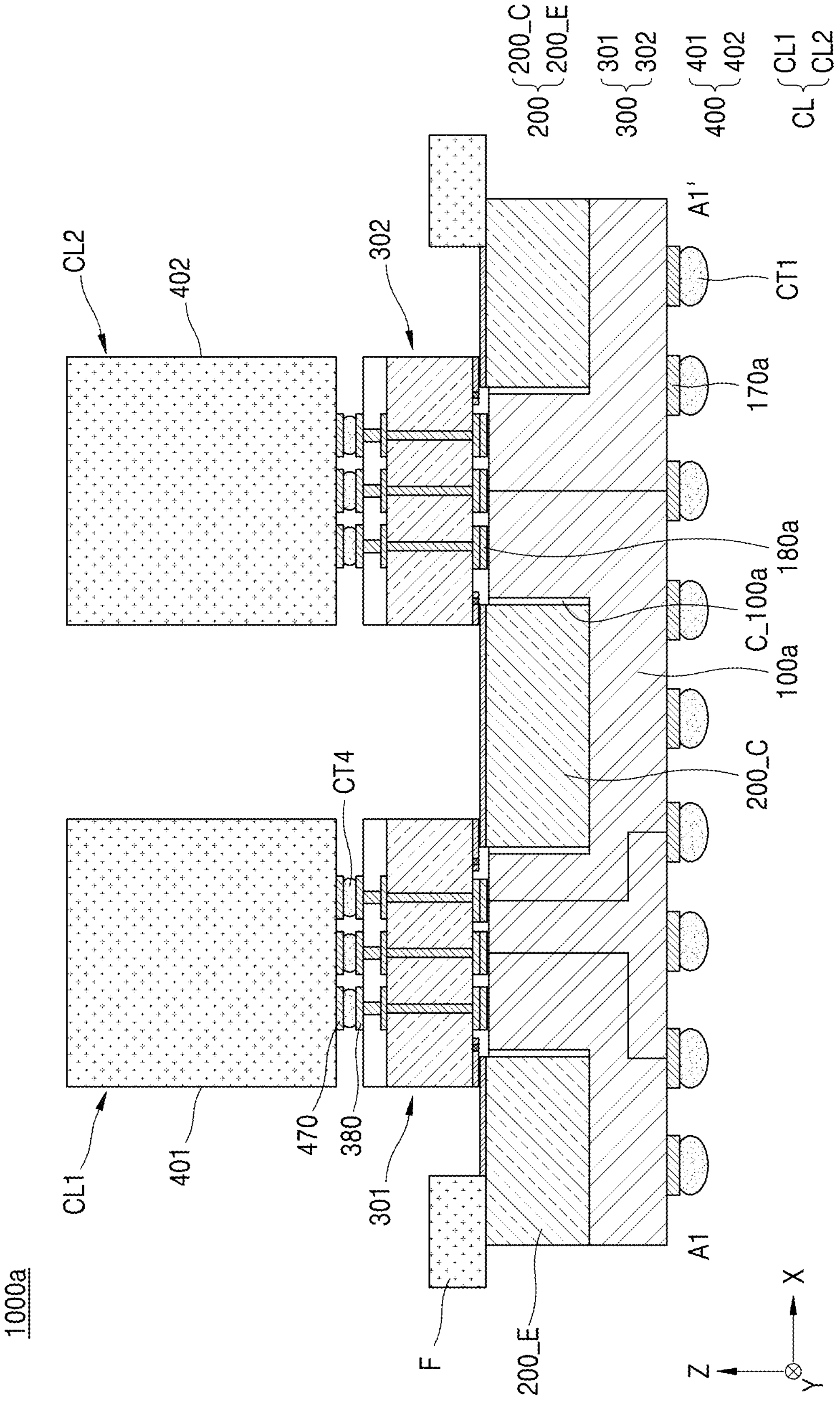
FIG. 4 is a schematic cross-sectional view of a semiconductor package according to an embodiment, taken along a line A-A' of FIG. 1.

FIG. 4 is a schematic cross-sectional view of a semiconductor package 1000*a* according to an embodiment, taken along a line A-A' of FIG. 1.

Most of the components constituting the semiconductor package 1000*a* described below and materials constituting the components thereof are substantially the same as or similar to those described with reference to FIG. 1 above. Therefore, for convenience of explanation, descriptions below will focus on the differences between the semiconductor package 1000*a* of FIG. 4 and the semiconductor package 1000 of FIG. 1 described above.

The semiconductor package 1000*a* may include a package substrate 100*a*. The package substrate 100*a* may be a printed circuit board.

The package substrate 100*a* may include a core insulation layer including at least one material selected from among phenol resin, epoxy resin, and polyimide. For example, the core insulation layer may include at least one material selected from among polyimide, Flame Retardant 4 (FR-4), tetrafunctional epoxy, polyphenylene ether, epoxy/polyphenylene oxide, Bismaleimide triazine (BT), Thermount, cyanate ester, and a liquid crystal polymer.

The package substrate 100*a* may include an upper pad 180*a* located on the top surface of the core insulation layer and a lower pad 170*a* located on the bottom surface of the core insulation layer. The upper pad 180*a* and the lower pad 170*a* may be portions of circuit wires patterned after the top surface and the bottom surface of the core insulation layer are coated with copper foil (Cu foil). In detail, the upper pad 180*a* and the lower pad 170*a* may be regions of circuit wires that are not covered by a solder resist layer and are exposed to the outside.

According to some embodiments, the upper pad 180*a* and the lower pad 170*a* may each include copper, nickel, stainless steel, or beryllium copper. Internal wires for electrically interconnecting the upper pad 180*a* to the lower pad 170*a* may be formed within the package substrate 100*a*.

The package substrate 100*a* may include a plurality of cavities C_100*a* recessed from the top surface of the package substrate 100*a* into the package substrate 100*a*. Each of the plurality of photonics bridge chips 200 may be located in one of the plurality of cavities C_100*a*. However, aspects of the inventive concept are not limited thereto, and two or more photonics bridge chips may be located in one cavity. The plurality of photonics bridge chips 200 may be electrically insulated from (e.g., not electrically connected to) the package substrate 100*a*, the upper pad 180*a* and, the lower pad 170*a*.

According to some embodiments, the plurality of cavities C_100*a* may include a center cavity located in the center region of the package substrate 100*a* and edge cavities located in an edge region of the package substrate 100*a*. The center photonics bridge chip 200_C may be located in the center cavity, and the edge photonics bridge chips 200_E may be located in the edge cavities.

According to some embodiments, a molding layer may be located between each of the plurality of cavities C_100*a* of the package substrate 100*a* and a corresponding photonics bridge chip. The molding layer may protect the package substrate 100*a* and the plurality of photonics bridge chips 200 from the outside.

According to some embodiments, bridge waveguides of the plurality of photonics bridge chips 200 and waveguides of the photonics chips 300 may be optically connected to each other. For example, the bridge waveguides of the plurality of photonics bridge chips 200 and the waveguides of the photonics chips 300 may be optically connected to each other through a grating coupler.

For example, although the bridge waveguide 231_C (refer to FIG. 3) of the first center photonics bridge chip 201_C (refer to FIG. 3) is spaced apart from the first waveguide 331 (refer to FIG. 3) of the first photonics chip 301 and the second waveguide 332 (refer to FIG. 3) of the second photonics chip 302, the bridge waveguide 231_C (refer to FIG. 3) of the first center photonics bridge chip 201_C (refer to FIG. 3) may be optically connected to the first waveguide 331 (refer to FIG. 3) of the first photonics chip 301 and the second waveguide 332 (refer to FIG. 3) of the second photonics chip 302 through a grating coupler.

By mounting the plurality of photonics bridge chips 200 in the plurality of cavities C_100*a* of the package substrate 100*a*, the size of the semiconductor package 1000*a* may be relatively reduced.

Figure 5:
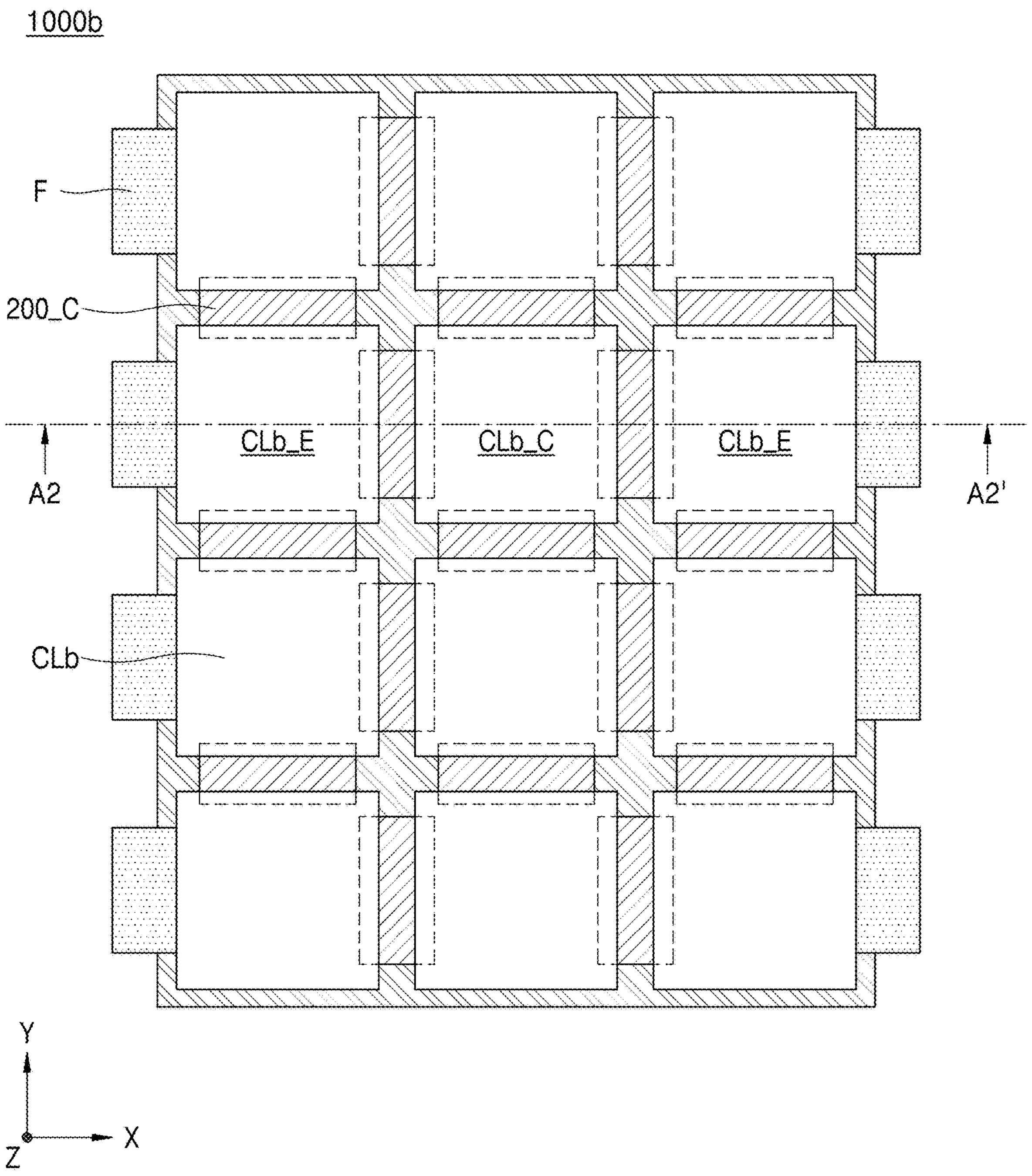
FIG. 5 is a schematic plan view of a semiconductor package according to an embodiment.
Figure 6:
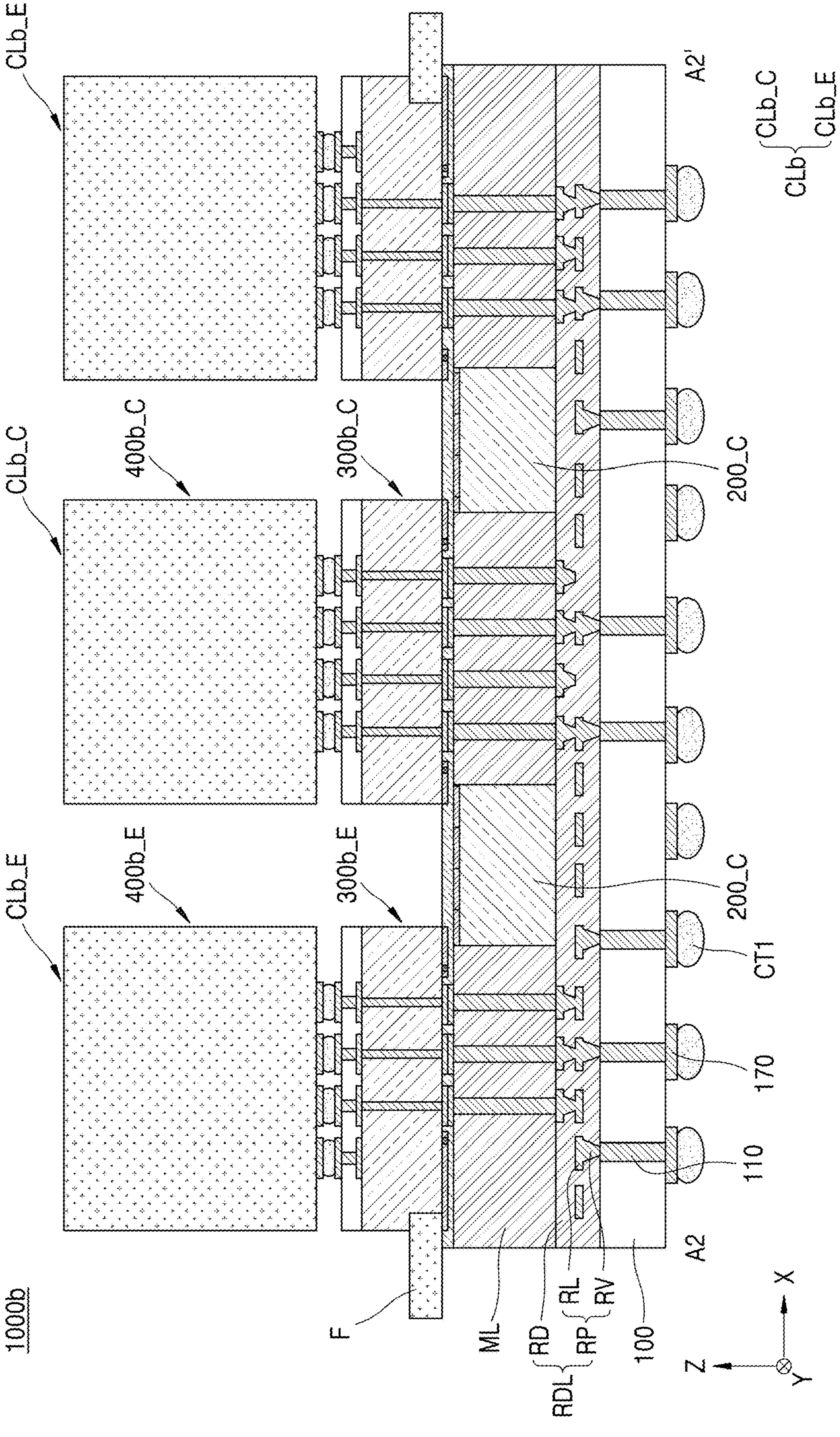
FIG. 6 is a schematic cross-sectional view of the semiconductor package of FIG. 5, taken along a line A2-A2' of FIG. 5.

FIG. 5 is a schematic plan view of a semiconductor package 1000*b* according to an embodiment. FIG. 6 is a schematic cross-sectional view of the semiconductor package 1000*b* of FIG. 5, taken along a line A2-A2' of FIG. 5.

Most of the components constituting the semiconductor package 1000*b* described below and materials constituting the components thereof are substantially the same as or similar to those described with reference to FIG. 1 above. Therefore, for convenience of explanation, descriptions below will focus on the differences between the semiconductor package 1000*b* of FIG. 5 and the semiconductor package 1000 of FIG. 1 described above.

The semiconductor package 1000*b* may include a plurality of chiplets CLb. The plurality of chiplets CLb may include a center chiplet CLb_C and edge chiplets CLb_E. The center chiplet CLb_C may be a chiplet located in the center region of the package substrate 100, and an edge chiplet CLb_E may be a chiplet located in the edge region of the package substrate 100.

The edge chiplet CLb_E may include an edge photonics chip 300*b*_E and an edge semiconductor chip 400*b*_E. The center chiplet CLb_C may include a center photonics chip 300*b*_C and a center semiconductor chip 400*b*_C. For example, the optical fiber F may be attached to the edge photonics chip 300*b*_E. According to some embodiments, the edge photonics chip 300*b*_E includes a groove inwardly recessed from a side surface of the edge photonics chip 300*b*_E, and the optical fiber F may be attached in the groove.

For example, a waveguide of the edge photonics chip 300*b*_E and the optical fiber F may be optically connected through a grating coupler. However, aspects of the inventive concept are not limited thereto, and the waveguide of the edge photonics chip 300*b*_E and the optical fiber F may be optically connected through an edge coupler.

An optical signal introduced from the optical fiber F to the edge photonics chip 300*b*_E may travel to the center photonics bridge chip 200_C along the waveguide of the edge photonics chip 300*b*_E or may be converted into an electrical signal and travel to the edge semiconductor chip 400*b*_E.

According to some embodiments, the plurality of photonics bridge chips may include only the center photonics bridge chips 200_C. For example, from among the plurality of photonics bridge chips, there may not be a photonics bridge chip to which the optical fiber F is attached.

The center photonics bridge chip 200_C may transmit optical signals between the edge photonics chip 300*b*_E and the center photonics chip 300*b*_C. For example, the center photonics bridge chip 200_C may transmit an optical signal emitted from the edge photonics chip 300*b*_E to the center photonics chip 300*b*_C and transmit an optical signal emitted from the center photonics chip 300*b*_C to the edge photonics chip 300*b*_E.

Figure 7:
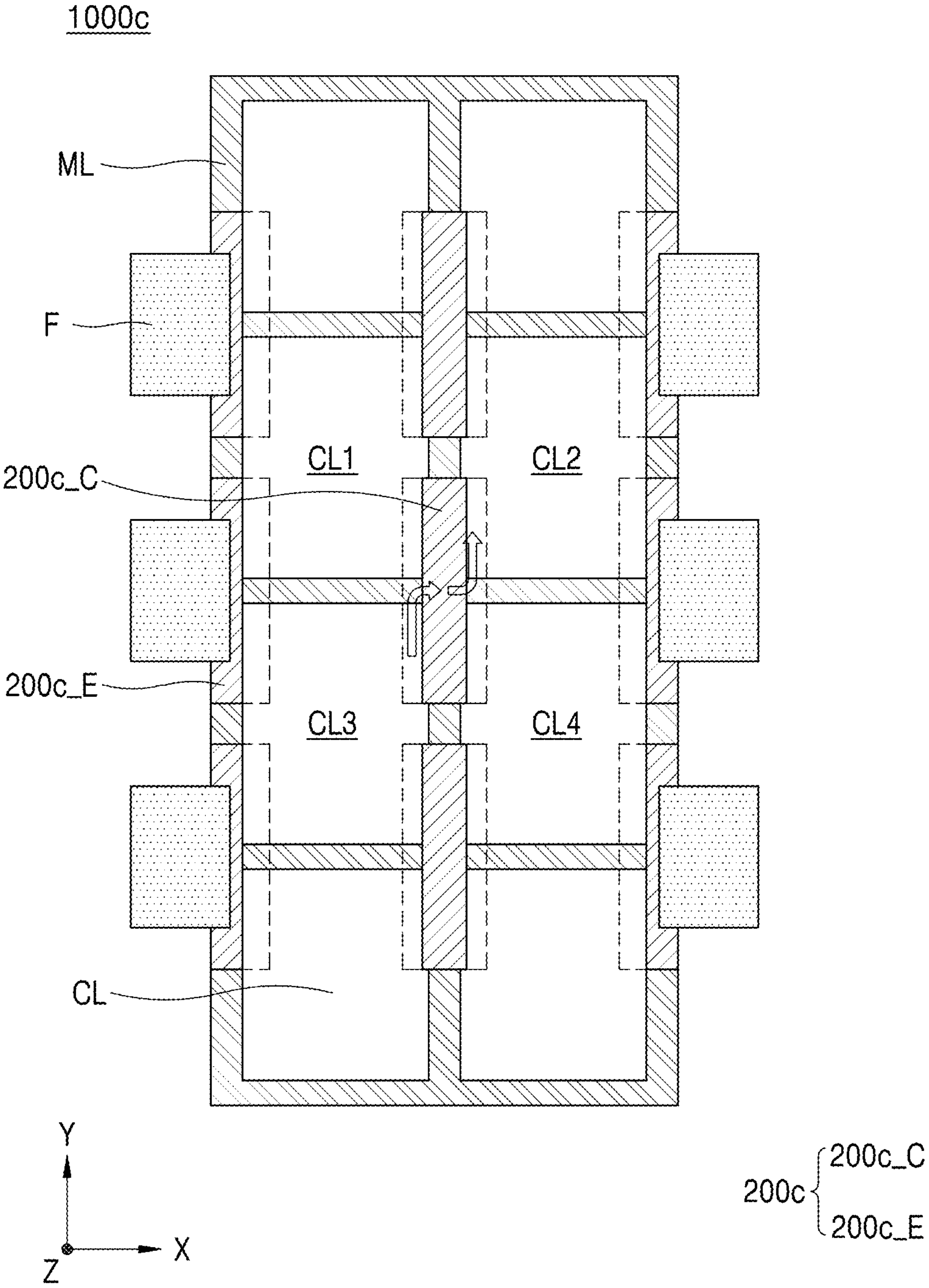
FIG. 7 is a schematic plan view of a semiconductor package according to an embodiment.

FIG. 7 is a schematic plan view of a semiconductor package 1000*c* according to an embodiment.

Most of the components constituting the semiconductor package 1000*c* described below and materials constituting the components thereof are substantially the same as or similar to those described with reference to FIG. 1 above. Therefore, for convenience of explanation, descriptions below will focus on the differences between the semiconductor package 1000*c* of FIG. 7 and the semiconductor package 1000 of FIG. 1 described above.

A plurality of photonics bridge chips 200*c* of the semiconductor package 1000*c* may overlap at least two chiplets in the vertical direction (Z direction). For example, an edge photonics bridge chip 200*c*_E may be optically connected to two chiplets, and a center photonics bridge chip 200*c*_C may be optically connected to four chiplets. For example, four chiplets adjacent to one another from among the plurality of chiplets CL may overlap one center photonics bridge chip 200*c*_C in the vertical direction.

According to some embodiments, the plurality of chiplets CL may include first to fourth chiplets CL1, CL2, CL3, and CL4. The first chiplet CL1 may be spaced apart from the second chiplet CL2 in the first horizontal direction (X direction), the second chiplet CL2 may be spaced apart from the third chiplet CL3 in the second horizontal direction (Y direction), the third chiplet CL3 may be spaced apart from the fourth chiplet CL4 in the first horizontal direction (X direction), and the fourth chiplet CL4 may be spaced apart from the first chiplet CL1 in the second horizontal direction (Y direction).

The center photonics bridge chip 200*c*_C may overlap the first to fourth chiplets CL1, CL2, CL3, and CL4 in the vertical direction (Z direction). For example, the center photonics bridge chip 200*c*_C may transmit an optical signal output from the third chiplet CL3 to the second chiplet CL2. For example, the center photonics bridge chip 200*c*_C may serve as a path through which optical signals travel between a plurality of overlapping chiplets. The center photonics bridge chip 200*c*_C may overlap the plurality of chiplets CL, and thus an optical signal emitted from one chiplet may travel to another one of the plurality of chiplets, depending on a pattern of the waveguide of the center photonics bridge chip 200*c*_C.

Since the center photonics bridge chip 200*c*_C overlaps a plurality of chiplets that are relatively far apart, coupling loss may be reduced when optical signals are transmitted between the plurality of chiplets that are relatively far apart.

The edge photonics bridge chip 200*c*_E overlaps the first chiplet CL1 and the third chiplet CL3 in the vertical direction (Z direction), and the optical fiber F may be attached to the edge photonics bridge chip 200*c*_E. An optical signal introduced from the optical fiber F may be transmitted to the first chiplet CL1 or the third chiplet CL3. The edge photonics bridge chip 200*c*_E overlaps the plurality of chiplets CL, and, according to the pattern of the waveguide of the edge photonics bridge chip 200*c*_E, an optical signal introduced from the optical fiber F may travel to one of the plurality of chiplets CL.

While aspects of the inventive concept have been particularly shown and described with reference to embodiments thereof, it will be understood that various changes in form and details may be made therein without departing from the spirit and scope of the following claims.

What is claimed is:

1. A semiconductor package comprising:

a package substrate;

a plurality of photonics bridge chips located on the package substrate;

a molding layer located on the package substrate, surrounding the plurality of photonics bridge chips, and comprising a plurality of via electrodes; and a plurality of chiplets located on the molding layer and the plurality of photonics bridge chips, each of the plurality of chiplets comprising a photonics chip and a semiconductor chip located on the photonics chip, wherein the plurality of chiplets are spaced apart from each other in a horizontal direction, and at least two chiplets adjacent to each other from among the plurality of chiplets overlap one photonics bridge chip from among the plurality of photonics bridge chips in a vertical direction.

2. The semiconductor package of claim 1, wherein a bridge waveguide is located on a top surface of each of the plurality of photonics bridge chips, and a waveguide is located on a bottom surface of the photonics chip of each of the plurality of chiplets.

3. The semiconductor package of claim 1, wherein the plurality of chiplets comprise a first chiplet comprising a first photonics chip and a first semiconductor chip and a second chiplet comprising a second photonics chip and a second semiconductor chip, the plurality of photonics bridge chips comprise a first center photonics bridge chip that overlaps the first chiplet and the second chiplet in the vertical direction, a center bridge waveguide is located on a top surface of the first center photonics bridge chip, a first waveguide is located on a bottom surface of the first photonics chip, and a second waveguide is located on a bottom surface of the second photonics chip.

4. The semiconductor package of claim 3, wherein one end of the first center photonics bridge chip is located below the first photonics chip, and the other end of the first center photonics bridge chip is located below the second photonics chip.

5. The semiconductor package of claim 4, wherein a horizontal area of the first center photonics bridge chip is less than a horizontal area of the first photonics chip and a horizontal area of the second photonics chip.

6. The semiconductor package of claim 3, wherein one end of the center bridge waveguide overlaps the first waveguide in the vertical direction, and the other end of the center bridge waveguide overlaps the second waveguide in the vertical direction.

7. The semiconductor package of claim 6, wherein the center bridge waveguide and the first waveguide are optically connected through an evanescent coupler, and the center bridge waveguide and the second waveguide are optically connected to each other through an evanescent coupler.

8. The semiconductor package of claim 1, wherein some of the plurality of photonics bridge chips overlap one of the plurality of chiplets in the vertical direction.

9. The semiconductor package of claim 1, wherein the photonics chip of each of the plurality of chiplets comprises an active surface and an inactive surface facing the active surface, the inactive surface of the photonics chip of the plurality of chiplets faces the plurality of photonics bridge chips, and a waveguide is located on the inactive surface of the photonics chip.

10. The semiconductor package of claim 1, wherein the photonics chip of each of the plurality of chiplets is electrically connected to the package substrate through the via electrodes of the molding layer, and the plurality of photonics bridge chips are not electrically connected to the package substrate.

11. The semiconductor package of claim 1, wherein the plurality of photonics bridge chips comprise an edge photonics bridge chip and a center photonics bridge chip, the edge photonics bridge chip is located at an edge region of the package substrate and is optically connected to an optical fiber, and the center photonics bridge chip is located in a center region of the package substrate and vertically overlaps at least two of the plurality of chiplets.

12. The semiconductor package of claim 11, wherein the edge photonics bridge chip overlaps one of the plurality of chiplets in the vertical direction.

13. The semiconductor package of claim 1, wherein, from among the plurality of chiplets, an edge chiplet located at an edge of the package substrate is optically connected to an optical fiber, and the plurality of photonics bridge chips overlap at least two chiplets from among the plurality of chiplets in the vertical direction.

14. The semiconductor package of claim 13, wherein the photonics chip of the edge chiplet comprises a groove inwardly recessed from a side surface, and the optical fiber is located within the groove.

15. A semiconductor package comprising:

a package substrate comprising a plurality of cavities extending inward from a top surface of the package substrate;

a plurality of photonics bridge chips located within the plurality of cavities of the package substrate, respectively; and a plurality of chiplets located on the package substrate and the plurality of photonics bridge chips, each of the plurality of chiplets comprising a photonics chip and a semiconductor chip located on the photonics chip, wherein the plurality of chiplets are spaced apart from each other in a horizontal direction, and at least two chiplets adjacent to each other from among the plurality of chiplets overlap one photonics bridge chip from among the plurality of photonics bridge chips in a vertical direction.

16. The semiconductor package of claim 15, wherein a bridge waveguide is located on a top surface of each of the plurality of photonics bridge chips, and the photonics chip of each of the plurality of chiplets comprises a waveguide facing the bridge waveguide.

17. The semiconductor package of claim 16, wherein waveguides of photonics chips of the plurality of chiplets overlap the bridge waveguides of each of at least two photonics bridge chips from among the plurality of photonics bridge chips in the vertical direction.

18. A semiconductor package comprising:

a package substrate;

a redistribution layer located on the package substrate;

a plurality of photonics bridge chips located on the redistribution layer;

a molding layer located on the redistribution layer, surrounding the plurality of photonics bridge chips, and comprising a plurality of via electrodes; and a plurality of chiplets located on the molding layer and the plurality of photonics bridge chips, each of the plurality of chiplets comprising a photonics chip and a semiconductor chip located on the photonics chip, wherein the plurality of chiplets are spaced apart from each other in a horizontal direction, at least two chiplets adjacent to each other from among the plurality of chiplets overlap one of the plurality of photonics bridge chips in a vertical direction, and the photonics chip comprises an active surface, an inactive surface facing the active surface, and a waveguide located on the inactive surface.

19. The semiconductor package of claim 18, wherein some of the plurality of photonics bridge chips overlap one of the plurality of chiplets in the vertical direction.

20. The semiconductor package of claim 18, wherein an active surface of the photonics chip of each of the plurality of chiplets faces the semiconductor chip, each of the plurality of photonics bridge chips comprises a bridge waveguide located on a top surface thereof, and the waveguide and the bridge waveguide face each other in the vertical direction.

* * * * *